United States Patent
Welbon et al.

(10) Patent No.: US 7,288,723 B2
(45) Date of Patent: Oct. 30, 2007

(54) CIRCUIT BOARD INCLUDING ISOLATED SIGNAL TRANSMISSION CHANNELS

(75) Inventors: Edward Hugh Welbon, Austin, TX (US); Roy Stuart Moore, Georgetown, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 568 days.

(21) Appl. No.: 10/405,440

(22) Filed: Apr. 2, 2003

(65) Prior Publication Data

US 2004/0196112 A1      Oct. 7, 2004

(51) Int. Cl.
H05K 1/03    (2006.01)
H05K 3/02    (2006.01)
H05K 3/10    (2006.01)
H01R 9/00    (2006.01)
H03H 7/38    (2006.01)

(52) U.S. Cl. .................. 174/255; 361/772; 29/846; 333/32

(58) Field of Classification Search ............. 174/255, 174/261; 361/799, 772–776; 333/32–35; 29/846–850
See application file for complete search history.

(56) References Cited

U.S. PATENT DOCUMENTS

| | | | |
|---|---|---|---|
| 5,756,932 A * | 5/1998 | Barnett | 174/391 |
| 5,981,869 A * | 11/1999 | Kroger | 174/388 |
| 6,433,286 B1 | 8/2002 | Doberenz | |
| 6,483,714 B1 * | 11/2002 | Kabumoto et al. | 361/760 |
| 6,538,524 B1 * | 3/2003 | Miller | 333/12 |
| 2004/0165368 A1 * | 8/2004 | Norte et al. | 361/816 |

OTHER PUBLICATIONS

U.S. Appl. No. 10/001,781, filed Oct. 24, 2001, Novak et al.

* cited by examiner

*Primary Examiner*—Jeremy C. Norris
(74) *Attorney, Agent, or Firm*—Meyertons Hood Kivlin Kowert & Goetzel, P.C.; B. Noël Kivlin

(57) ABSTRACT

A circuit board including a signal transmission channel includes a dielectric substrate and a signal transmission channel which may be formed on the dielectric substrate. The signal transmission channel may include a conductor, a lossy dielectric material which may longitudinally encapsulate the conductor and a conductive material which may longitudinally encapsulate the lossy dielectric.

18 Claims, 3 Drawing Sheets

CIRCUIT BOARD INCLUDING ISOLATED SIGNAL TRANSMISSION CHANNELS

BACKGROUND OF THE INVENTION

1. Field of the Invention

This invention relates to circuit boards and, more particularly, to signal paths which provide improved signal integrity.

2. Description of the Related Art

Circuit boards come in many different types. One common type of circuit board is a printed circuit board. Printed circuit boards generally have one or more layers of insulating or dielectric material which may be laminated together. Each layer may include multiple signal paths or "signal traces" which are used to propagate signals. In addition, some layers may be used only to provide power or ground and may be considered as a solid plane. These types of layers are typically referred to generally as a reference plane or as power and ground planes, respectively. Further, other layers may include both power or ground planes as well as signal traces.

The circuit board is typically made from an insulating material such as fiberglass or similar dielectric material which may provide isolation between signal traces as well as a rigid backing for mechanical strength.

The signal traces are typically thin metallic "wires" which have been etched from a pattern which has been printed onto a metal layer which may be bonded to the surface of the circuit board. The metal is generally copper or some other similar conductive copper alloy. Depending on the type of process used to manufacture the circuit board, the unused metal may be etched away leaving the signal traces and any other metallic contact surfaces intact.

At high frequencies, the traces on a circuit board may act like transmission lines, thus certain trace characteristics become important when considering signal integrity. Generally, for maximum power transfer and minimum signal reflection it is important to match the impedance of the load to the impedance of the source and additionally to the impedance of the transmission line. Depending on how well these impedances are matched may determine how much the input signal is distorted or reflected as it propagates down the trace.

Generally, the traces are routed to have as much space between traces as possible. However, depending on such factors as the density of the signal traces and circuit components, signal traces may necessarily be routed very close together. Depending on the frequency of the routed signals, routing the traces close together may cause problems such as cross-talk, for example. Cross-talk refers to a condition where the coupling capacitance between two adjacent traces allows signals which reach a critical frequency to interfere with each other.

The impedance of the transmission line is generally referred to as the characteristic impedance. The equations that are used to determine the characteristic impedance include incremental values of inductance, capacitance, resistance and leakage which may also be referred to as conductance. The characteristic impedance may be calculated for a given transmission line. Generally, if the transmission line impedance does not match the impedance of the load and the impedance of the source, the behavior of the transmission line may be changed (i.e., tuning) by adding predetermined impedance components along the length of the transmission line.

However, it may be difficult if not impossible to adjust the behavior of a signal trace on a conventional circuit board, particularly a densely populated circuit board. Thus to convey signals at very high frequencies on a conventional circuit board, even a well-routed trace may induce signal distortion due to an impedance mismatch. Therefore, the frequency of operation of a conventional circuit board may be limited.

SUMMARY OF THE INVENTION

Various embodiments of a circuit board including a signal transmission channel are disclosed. In one embodiment, the circuit board includes a dielectric substrate and a signal transmission channel which may be formed on the dielectric substrate. The signal transmission channel may include a conductor, a lossy dielectric material which may longitudinally encapsulate the conductor and a conductive material which may longitudinally encapsulate the lossy dielectric.

Figure 1:
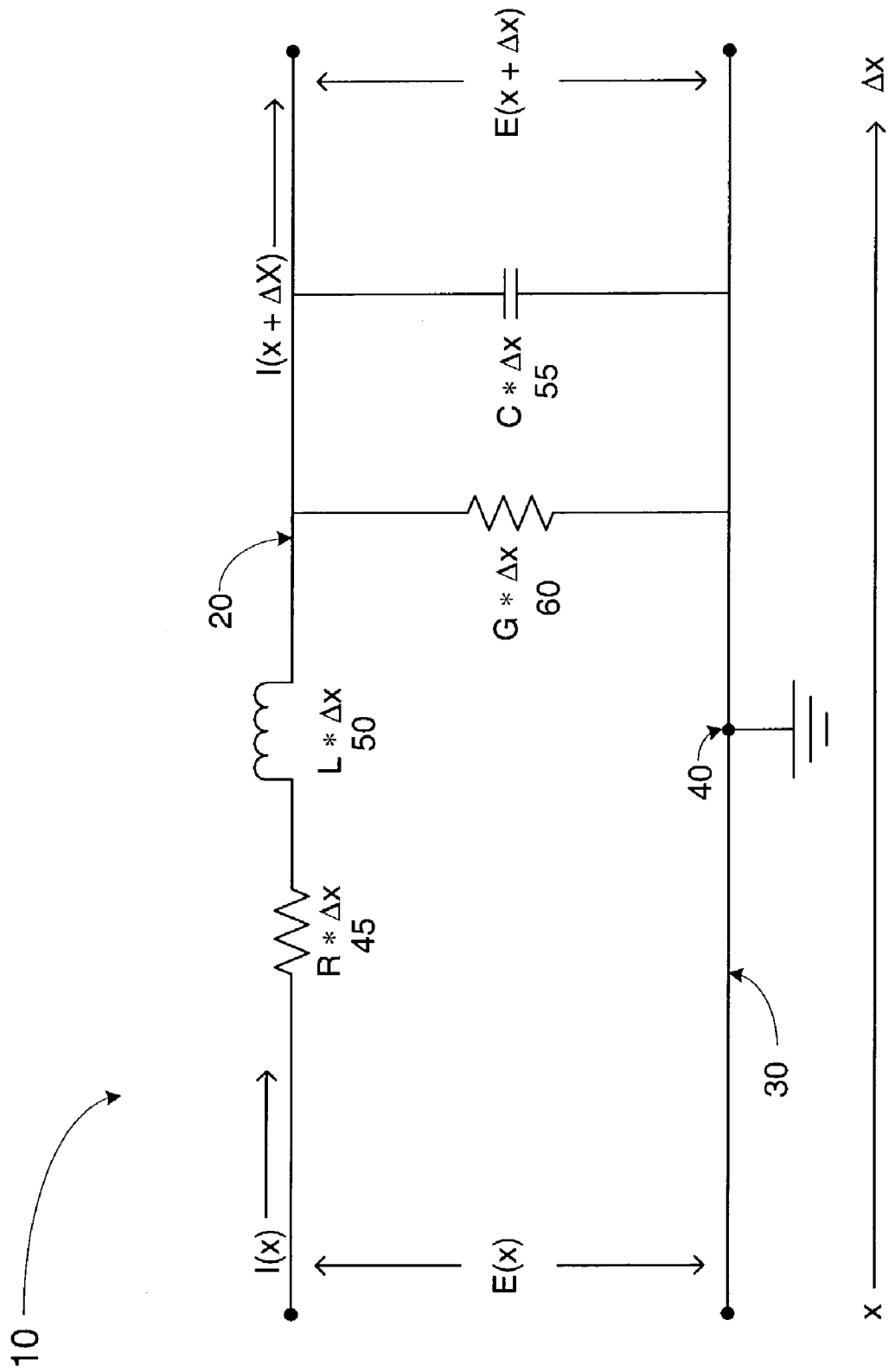
FIG. 1 is a schematic diagram illustrating an incremental portion of an exemplary transmission line.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Turning now to FIG. 1, a schematic diagram of an incremental portion of an exemplary transmission line is shown. The transmission line 10 includes a signal path 20 and a return path 30. The return path includes a circuit ground connection 40. As described above, a transmission line has a characteristic impedance. The characteristic impedance includes values of resistance 'R', capacitance 'C', inductance 'L' and leakage or conductance 'G'. Accordingly, transmission line 10 includes circuit component values of R, L, C and G per unit length. For example, Resistance 45, inductance 50, capacitance 55 and admittance 60 are representative of the incremental impedance components of the transmission line 10. The position (x) at any point along transmission line 10 may be given by (x+Δx), where x is the leftmost point of transmission line 10.

In the illustrated embodiment, resistance 45 has a value of R multiplied by Δx (the incremental change per unit length along transmission line 10). Inductance 50 has a value of L multiplied by Δx. Capacitance 55 has a value of C multiplied by Δx and admittance 60 has a leakage value of G multiplied by Δx.

Due to the varying impedance per unit length, voltage and current will vary with position. A voltage E(x) applied to transmission line 10 at position x may have a value of E(x+Δx) when it reaches the position Δx and a corresponding current I(x) may have a value of I(x+Δx) when it reaches the position Δx. Thus, as noted above, the amount of signal attenuation, delay and distortion may be dependent upon how well the source, load and characteristic impedance of transmission line 10 are matched.

The general expression for the voltage in the Laplace frequency domain may be $$E(s) = V(s) \frac{\frac{R_{Load}}{2Z_{TL}}}{\left[1 + \frac{R_{Source}}{Z_{TL}}\right]\left[1 + \frac{R_{Load}}{Z_{TL}}\right]e^{\lambda l} - \left[1 + \frac{R_{Source}}{Z_{TL}}\right]\left[1 + \frac{R_{Load}}{Z_{TL}}\right]e^{-\lambda l}}$$

where $s = i\omega$.

The characteristic impedance may be shown to be $$Z_{TL} = \sqrt{\frac{R + sL}{G + sC}}$$

and the propagation constant per unit length may be $\lambda = \sqrt{(sL+R)(sC+G)}$.

In the general case, these parameters interact with the value of $s = \alpha + i\omega$ and thus the output voltage response E(s) will have frequency spectrum different from that of the input voltage V(s). This implies that even if the source and load impedances are matched but the characteristic impedance of the transmission line is not tuned, the output signal E(s), 0 may be distorted by reflections, depending upon the frequency of the signal. As mentioned above, transmission line 10 may be tuned by adjusting the impedance at specific places along the transmission line. Generally speaking, if transmission line 10 is a signal trace on a circuit board, placing any components along the trace may be impractical and in some cases impossible. This may be particularly true when adjusting the leakage component. Most circuit board layer materials have a strictly controlled leakage level to prevent cross-talk between traces. Thus, as will be described in greater detail below in conjunction with the descriptions of FIG. 2 through FIG. 4, a circuit board including a special trace or signal transmission channel may provide a controlled amount of leakage while improving the integrity of a propagated signal by decreasing cross-talk and reducing reflections.

The amount of leakage may be calculated using the characteristic impedance equations and satisfying the condition L·G=C·R. This condition may be referred to as the distortion-free case. In this case, the characteristic impedance simplifies to $$Z_{TL} = \sqrt{\frac{L}{C}} = \sqrt{\frac{R}{G}}$$

and the propagation constant simplifies to $\lambda = s\sqrt{LC} + \sqrt{RG}$.

For the impedance matched case, $R_{Load} = R_{Source} = Z_{TL}$. Thus in the distortion-free case, the output voltage may be expressed as $$E(s) = \frac{e^{\lambda x}}{2}V(s) = \frac{e^{-(s\sqrt{LC} + \sqrt{RG})x}}{2}V(s).$$

The inverse transform then yields $$E(t, x) = \frac{V(t - x\sqrt{LC})e^{-x\sqrt{RG}}}{2}.$$

However, the source voltage V(t) at the input to the transmission line is E(t,0). Thus, for the impedance matched case, the output voltage may be expressed as $$E(t,x) = E(t - x\sqrt{LC}, 0)e^{-x\sqrt{RG}},$$

where $x\sqrt{LC}$ is a propagation time and $e^{-x\sqrt{RG}}$ is an attenuation factor. This equation shows that the final voltage at the output of transmission line 10 may be a delayed and attenuated replica of the input signal with a relatively unaltered frequency spectrum. The delay and attenuation may depend only on the length of the transmission line. Further, the input waveform may not be distorted when the incremental transmission line parameters are controlled such that they meet the distortion-free case. This may be particularly interesting since in a typical transmission line application, attenuation may not be desirable. Due to the lengths of a typical transmission line, having a non-zero leakage value may result in an unacceptable amount of signal attenuation. However, as described further below, when applied to lengths associated with circuit boards, the leakage values may be controlled such that the attenuation is manageable.

Figure 2:
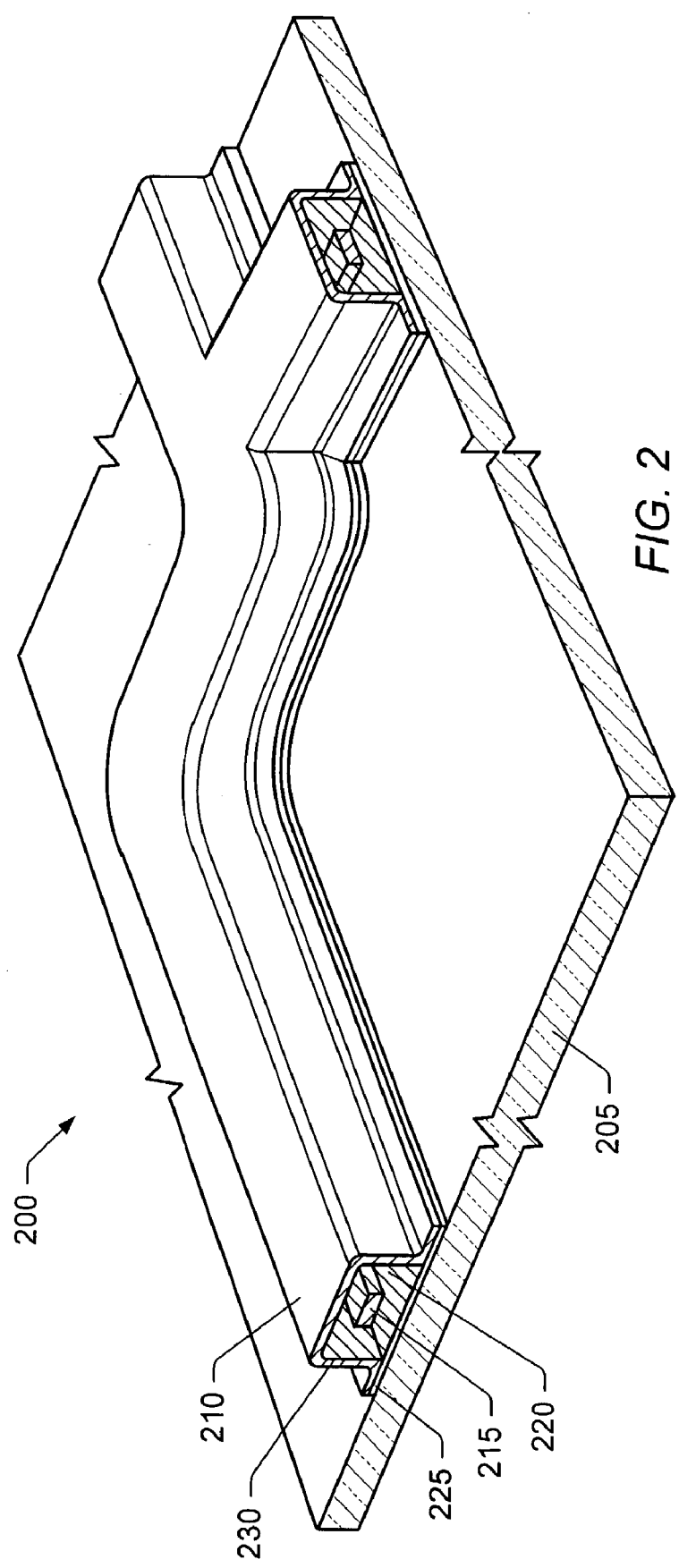
FIG. 2 is a perspective view diagram of one embodiment of a circuit board including a signal transmission channel.

Referring to FIG. 2, a perspective view diagram of one embodiment of portion of a circuit board including a signal transmission channel is shown. Circuit board 200 includes a substrate 205 for circuit board 200. In one embodiment, substrate 205 may be a dielectric material. In an alternative embodiment, substrate 205 may be a conductive material. In either case, substrate 205 may provide mechanical support for circuit board 200. Circuit board 200 also includes a signal transmission channel 210. Signal transmission channel 210 includes a channel wall including a conductive surface 225 and a conductive surface 230. Signal transmission channel 210 also includes a conductor 215 and a dielectric material 220 which encapsulates conductor 215 in a longitudinal direction.

Dielectric material 220 is a lossy dielectric. As used herein, a lossy dielectric refers to a dielectric which exhibits a non-negligible amount of conductance or leakage. In one embodiment, dielectric material 220 may have a predetermined amount of leakage and dielectric constant per unit length. The predetermined amount of leakage may be calculated using the above equations. For example, using the incremental values of L, C and R, the value of G may be calculated to such that $$G = \frac{CR}{L}.$$

The value of G may be calculated based upon the value of R and an acceptable level of signal attenuation. It is noted that the predetermined amount of leakage may be adjusted during manufacture. It is further noted that dielectric material 220 may also include materials having adjustable parameters which may yield a desirable combination of permeability, permittivity and conductivity.

In one embodiment, dielectric material 220 may be a conductive polymer such as a carbon-based resistive paste which may be applied and hardened during subsequent manufacturing steps. In other embodiments, dielectric material 220 may be another type of suitable material having the desired dielectric properties and manufacturability.

In the illustrated embodiment, signal transmission channel 210 includes straight sections and curved sections. In addition, signal transmission channel 210 may also include connection points which may allow another section to 'Tee' into a given section.

In the illustrated embodiment, the amount of leakage may be precisely controlled to effectuate the above distortion-free case due to the encapsulation of the conductor 215 and dielectric material 220 within a conductive shell including conductive surfaces 225 and 230. Further, on circuit boards having multiple signal transmission channels, each channel may be independently tuned to provide the desired dielectric properties. It is noted that dielectric material 220 may have a given leakage value in one section of signal transmission channel 210 and a second leakage value in another section of signal transmission channel 210. Thus, depending on specific configurations, signal transmission channel 210 may be tuned more effectively.

In one embodiment, conductive surface 225 and conductive surface 230 may be connected to circuit ground, thereby providing a signal shield for conductor 215.

To illustrate some typical leakage values, an exemplary leakage value G for dielectric material 220 may be calculated using typical circuit board parameters. Given a copper conductor 215 having a size ranging from approximately 1 mil to 16 mil, a corresponding leakage value range may be 0.2 milli-mhos/ft to 2.5 milli-mhos/ft. The attenuation factor may be expressed as $\eta = e^{-x\sqrt{RG}}$. Then, assuming that a 10% signal attenuation is acceptable, this may support a trace length of more than 35 inches. These values of leakage and attenuation may be used to tune signal transmission channel 210 without significant signal loss. It is noted that these values are approximate and for discussion purposes and that other values may be used as desired.

Figure 3:
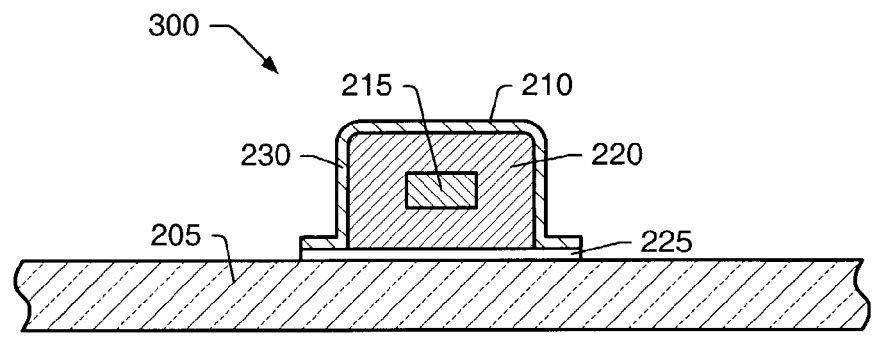
FIG. 3 is a diagram of a cross section one embodiment of a circuit board including a signal transmission channel.

Turning to FIG. 3, a cross-section of one embodiment of portion of a circuit board including a signal transmission channel is shown. Components that correspond to those shown in FIG. 2 are numbered identically for clarity and simplicity. Circuit board 300 includes a dielectric substrate 205 and a signal transmission channel 210. Similar to the description of FIG. 2, signal transmission channel 210 of FIG. 3 includes a channel wall including a conductive surface 225 and a conductive surface 230. Signal transmission channel 210 also includes a conductor 215 and a dielectric material 220 which encapsulates conductor 215 in a longitudinal direction. It is noted that although only a single signal transmission channel 210 is shown, other embodiments may include any suitable number of signal transmission channels, as desired.

In one embodiment, signal transmission channel 210 may be formed on substrate 205 using standard circuit board manufacturing techniques. Accordingly, conductive surface 225 may be a conductive sheet such as copper, for example, formed on the surface of substrate 205. Using subsequent processing steps, the various other parts of signal transmission channel 210 may be formed on substrate 205. For example, in one embodiment, a layer of dielectric material 220 may be formed, followed by conductor 215. Then, another layer of dielectric material 220 may be formed thus encapsulating conductor 215 in a longitudinal direction. Accordingly, conductive surface 230 may formed using a final step which may coat signal transmission channel 210. In one embodiment, conductive surface 230 may be formed using various techniques such as sputtering or chemical vapor deposition, for example. It is noted that although conductive surface 225 is shown extending to the edge of where conductive surface 230 extends, in other embodiments conductive surface 225 may extend further and may, in some embodiments, cover the entire surface of substrate 205.

In one embodiment, substrate 205 may be any suitable material including commonly used circuit board materials such as a fiberglass composite material, for example. However, since dielectric material 220 and conductor 215 are enclosed within the channel walls, interference and cross-talk between conductors may not be an issue. Hence in other embodiments, any material possessing the desired mechanical properties may be used.

Figure 4:
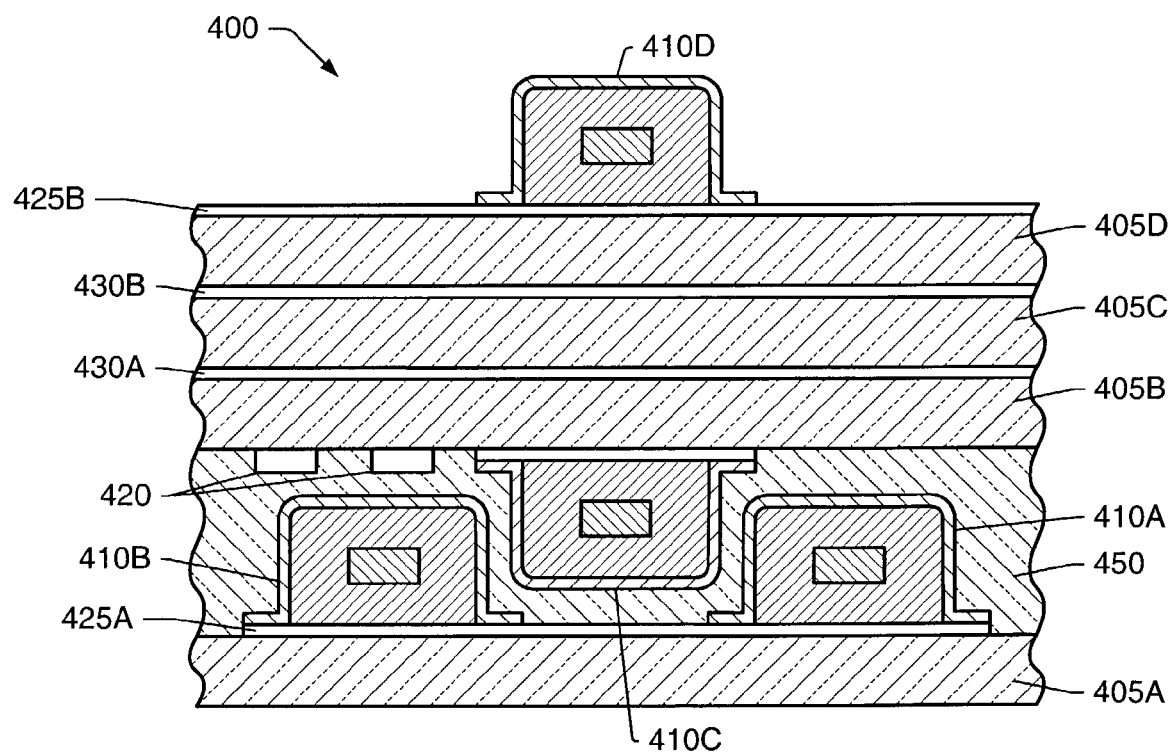
FIG. 4 is a diagram of a cross section one embodiment of a multi-layer circuit board including a plurality of signal transmission channels.

Referring to FIG. 4, a diagram illustrating a cross-section of one embodiment of a multi-layer circuit board including a plurality of signal transmission channels is shown. Components that correspond to those shown in FIG. 2 and FIG. 3 are numbered identically for clarity and simplicity. Circuit board 400 includes multiple circuit board layers. Each of the layers includes a substrate designated 405A-405D. For reference purposes, layer 1 includes substrate 405A, layer 2 includes substrate 405B and so forth.

Layer 1 includes substrate 405A and signal transmission channels 410A and 410B. Signal transmission channels 410A and 410B are each representative of the signal transmission channel illustrated in FIG. 2 and FIG. 3. As described above, conductive surface 425 is shared by signal transmission channels 410A and 410B. Although in other embodiments, signal transmission channels 410A and 410B may each have independent conductive surfaces 225.

In the illustrated embodiment, layer 2 includes substrate 405B and signal transmission channel 410C. In addition, layer 2 also includes two conventional circuit board traces designated 420. Signal transmission channel 410C is also representative of the signal transmission channel illustrated in FIG. 2 and FIG. 3. It is noted that substrate 405B also includes a conductive layer 430A on its top surface.

Between substrate 405A and 405B is a dielectric material 450. In one embodiment, dielectric material 450 may be any suitable material which provides both mechanical and electrical properties. For example, dielectric material 450 may provide enough dielectric properties to prevent cross-talk between traces 420.

Layer 3 includes substrate 405C and a conductive layer 430B on its top surface. It is noted that conductive layers 430A and 430B may be representative of ground and power planes as described above.

Layer 4 includes substrate 405D and signal transmission channel 410D. Signal transmission channel 410D is also representative of the signal transmission channel illustrated in FIG. 2 and FIG. 3. It is noted that in the illustrated embodiment, conductive surface 425B extends over the entire top surface of substrate 405D.

It is noted that the foregoing description of the layers illustrated in FIG. 4 is for illustrative purposes only. It is contemplated that any of the layers may include any number of signal transmission channels. Further, each layer may include various combinations of signal transmission channels, conventional traces, ground and power planes. In addition, the layers may be connected by vias (not shown). It is further noted that the construction of each of the signal transmission channels may cause them to be isolated not only from each other, but from any outside signal interference. Further, the construction of each of the signal transmission channels may provide a transmission medium which radiates less signal than conventional signal traces.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A circuit board comprising:
   a dielectric substrate; and
   a signal transmission channel formed on said dielectric substrate, wherein said signal transmission channel includes:
   a conductor;
   a lossy dielectric material longitudinally encapsulating said conductor, wherein said lossy dielectric material includes a first leakage value along a first length of said signal transmission channel and a second leakage value along a second length of said signal transmission channel; and
   a conductive material longitudinally encapsulating said lossy dielectric.

2. The circuit board as recited in claim 1, wherein said lossy dielectric material has a leakage value that is substantially equal to the capacitance multiplied by the resistance divided by the inductance.

3. The circuit board as recited in claim 1, wherein said lossy dielectric has a leakage value which is independent of a leakage value of said dielectric substrate.

4. The circuit board as recited in claim 1, wherein said lossy dielectric material is a carbon-based resistive polymer paste.

5. The circuit board as recited in claim 1 further comprising a plurality of said signal transmission channels formed on said dielectric substrate.

6. The circuit board as recited in claim 1 further comprising a plurality of additional layers formed on said dielectric substrate.

7. The circuit board as recited in claim 6, wherein said plurality of additional layers includes at least one power plane including a conductive layer formed on an additional dielectric substrate for conveying power.

8. The circuit board as recited in claim 6, wherein said plurality of additional layers includes at least one ground plane including a conductive layer formed on an additional dielectric substrate for providing circuit ground.

9. The circuit board as recited in claim 6, wherein said plurality of additional layers includes at least one signal layer including a plurality of said signal transmission channels formed on an additional dielectric substrate.

10. The circuit board as recited in claim 9, wherein each of said plurality of said signal transmission channels includes a lossy dielectric material having a leakage value that is independent of each other signal transmission channel.

11. A method comprising:
    transmitting a signal via a signal transmission channel of a circuit board;
    wherein the circuit board includes:
    a dielectric substrate; and
    said signal transmission channel formed on said dielectric substrate, wherein said signal transmission channel includes:
    a conductor;
    a lossy dielectric material longitudinally encapsulating said conductor, wherein said lossy dielectric material includes a first leakage value along a first length of said signal transmission channel and a second leakage value along a second length of said signal transmission channel; and
    a conductive material longitudinally encapsulating said lossy dielectric; and
    receiving the signal.

12. The method as recited in claim 11, wherein said lossy dielectric material has a leakage value that is substantially equal to the capacitance multiplied by the resistance divided by the inductance.

13. The method as recited in claim 11, wherein said lossy dielectric has a leakage value which is independent of a leakage value of said dielectric substrate.

14. The method as recited in claim 11, wherein said circuit board further comprises a plurality of additional layers formed on said dielectric substrate.

15. The method as recited in claim 14, wherein said plurality of additional layers includes at least one power plane including a conductive layer formed on an additional dielectric substrate for conveying power.

16. The method as recited in claim 14, wherein said plurality of additional layers includes at least one ground plane including a conductive layer formed on an additional dielectric substrate for providing circuit ground.

17. The method as recited in claim 14, wherein said plurality of additional layers includes at least one signal layer including a plurality of said signal transmission channels formed on an additional dielectric substrate.

18. The method as recited in claim 17, wherein each of said plurality of said signal transmission channels includes a lossy dielectric material having a leakage value that is independent of each other signal transmission channel.

* * * * *